United States Patent
Shimanek et al.

(10) Patent No.: US 7,023,744 B1
(45) Date of Patent: Apr. 4, 2006

(54) RECONFIGURABLE SRAM-ROM CELL

(75) Inventors: Schuyler E. Shimanek, Albuquerque, NM (US); Eric E. Edwards, Albuquerque, NM (US); Thomas J. Davies, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/717,343

(22) Filed: Nov. 18, 2003

(51) Int. Cl.
*G11C 7/00* (2006.01)

(52) U.S. Cl. .............................. 365/189.11; 365/225.7; 365/96; 326/38

(58) Field of Classification Search ................... 365/96, 365/154, 156, 190, 189.11, 145, 225.7, 230.05; 326/38–41
See application file for complete search history.

(56) References Cited

U.S. PATENT DOCUMENTS

| | | | |
|---|---|---|---|
| 5,487,037 A * | 1/1996 | Lee ........................ | 365/189.11 |
| 5,815,405 A | 9/1998 | Baxter | |
| 5,943,488 A * | 8/1999 | Raza ........................... | 716/19 |
| 5,986,923 A * | 11/1999 | Zhang et al. ................ | 365/154 |
| 6,490,707 B1 | 12/2002 | Baxter | |
| 6,539,508 B1 | 3/2003 | Patrie et al. | |
| 6,707,702 B1 * | 3/2004 | Komatsuzaki .............. | 365/145 |

OTHER PUBLICATIONS

Altera Corporation, "Section 1. Hardcopy Stratix Device Family Data Sheet," Hardcopy Device Handbook, vol. 1, Jun. 2003, Section 1-1 through 5-14,a vailable from Altera Corporation, 101 Innovation Drive, San Jose, California 95134.

Xilinx, Inc., "Hardwire Data Book," Mar. 1997, pp. 2-6 through 2-7, Available from Xilinx, Inc., 2100 Logic Drive, San Jose, CA 95124.

* cited by examiner

*Primary Examiner*—Vibol Tan
(74) *Attorney, Agent, or Firm*—Arthur J. Behiel; Justin Liu

(57) ABSTRACT

Described are programmable logic devices with configuration memory cells that function both as RAM and ROM. A PLD incorporating these memory cells to store configuration data can be mask-programmed with a customer design, rendering the PLD an application-specific integrated circuit (ASIC). The mask programming can be selectively disabled, in which case each configuration memory cell behaves as a static, random-access memory (SRAM) bit. In this mode, a PLD employing these dual-mode memory cells behaves as a reprogrammable PLD, and can therefore be tested using generic test procedures developed for the PLD. The dual-mode memory cells thus eliminate the burdensome task of developing application-specific test procedures for designs ported from a PLD. As an added benefit, in the ROM mode these memory cells are not susceptible to radiation-induced upsets, so for example, PLDs incorporating these memory cells are better suited for aerospace applications than conventional SRAM-based PLDs.

22 Claims, 5 Drawing Sheets

RECONFIGURABLE SRAM-ROM CELL

BACKGROUND

Programmable logic devices (PLDs) are a well-known type of digital integrated circuit that may be programmed by a user (e.g., a circuit designer) to perform specified logic functions. PLDs typically include an array of configurable logic elements that are programmably interconnected to each other and to programmable input/output blocks via some form of programmable interconnect. This collection of configurable logic may be customized by loading configuration data into internal configuration memory cells that define how the logic elements, interconnect, and input/output blocks are configured.

FIG. 1 is a block diagram depicting one form of PLD 100, which includes configurable logic and interconnect 105, configurable input/output blocks 110, input/output pins 115, and an array of non-volatile memory 120. PLD 100 is customized by loading non-volatile memory 120 with configuration data. PLD 100 then transfers the contents of memory 120 into static random-access memory cells (not shown) within configurable logic and interconnect 105 and input/output blocks 110 when PLD 100 is powered up. In field-programmable gate arrays (FPGAs), one popular form of PLD, non-volatile memory 120 is typically a separate integrated circuit.

FIG. 2 is a six-transistor static random-access memory cell (6T SRAM) 200 employed as in configuration memory of PLD 100 of FIG. 1. SRAM 200 includes a pair of cross-coupled inverters 205 and a pair of first and second access transistors 210A and 210Ab. SRAM 200 additionally includes complementary bitlines BL and BLb connected to the drains of respective access transistors 210A and 210Ab, and a write/read enable terminal WREN connected to the gates of access transistors 210A and 210Ab. Transistors 210A and 210Ab provide access to complementary bit nodes CBIT and CBITb of cross-coupled inverters 205 when an enable signal on write/read enable terminal WREN is asserted.

During a write operation, complementary voltages representative of a specified logic level are presented on complementary bitlines BL and BLb while an enable signal on terminal WREN is asserted. Cross-coupled inverters 205 then retain the complementary voltages, and hence the specified logic level.

During a read operation, an enable signal on terminal WREN connects bit nodes CBIT and CBITb to respective bitlines BL and BLb. Sense amplifiers (not shown) connected to the bitlines then sense the voltage levels provided on the bitlines by bit nodes CBIT and CBITb and provide a corresponding output signal. Inverters 205A and 205B require power to retain a logic level, and so lose stored data when powered down. As a consequence, PLDs that employ memory cell 200 to store configuration data are reconfigured each time power is applied.

The ease with which a given logic function can be implemented using a PLD makes PLDs very economical, especially in smaller quantities. In contrast, application-specific integrated circuits (ASICs) are more expensive for implementing a given design, but may be less expensive to produce in large quantities. Thus, a customer may want to design and implement a logic circuit using a PLD, taking advantage of the ease of design and the attendant reduction in time-to-market. Then, if economies of scale warrant, the customer may want to convert the PLD design into a design specification for a less expensive ASIC, such as a mask-programmed integrated circuit (MPIC).

Some PLD manufacturers offer customers the option of porting a PLD design specification into an ASIC design specification. For example, some manufacturers replace or override internal memory cells with metal connections that similarly define how the logic elements, interconnect, and input/output blocks are configured. The functional circuitry is the same between the original PLD and the mask-programmed ASIC, and this similarity greatly reduces the time and expense associated with porting a PLD design to another form of ASIC. The resulting devices are less expensive than a pure PLD solution because the non-volatile memory portion of the PLD is no longer necessary. For PLD 100 of FIG. 1, the omission of non-volatile memory 120 saves valuable die area, reduces the number of process steps, and improves yield. In FPGAs, the omission eliminates the need for a separate memory IC.

PLDs are complex devices that can be used to instantiate myriad designs. This complexity renders exhaustive testing difficult. Fortunately, generic test procedures that exhaustively test a PLD often obviate the need for design-specific tests: properly specified and simulated PLD designs are assured to work on fully tested PLDs. Unfortunately, when a PLD design is converted to an ASIC design, the resulting ASICs can no longer be tested using generic PLD test procedures. Design-specific tests are therefore developed, at considerable expense, each time a PLD design is ported to an ASIC.

SUMMARY

Described are programmable logic devices (PLDs) with configuration memory cells that function both as random-access memory (RAM) and read-only memory (ROM). PLDs incorporating these memory cells to store configuration data can be mask-programmed with a customer design, rendering the PLD an application-specific integrated circuit (ASIC). The mask programming can be selectively disabled, in which case each configuration memory cell behaves as a static, random-access memory (SRAM) bit. In this SRAM mode, a PLD employing these dual-purpose memory cells behaves as a reprogrammable PLD, and can therefore be tested using generic test procedures developed for the target PLD type. The dual-mode memory cells thus eliminate the burdensome task of developing application-specific test procedures for designs ported from a PLD to an ASIC.

This summary does not limit the invention, which is instead defined by the claims.

DETAILED DESCRIPTION

Figure 3:
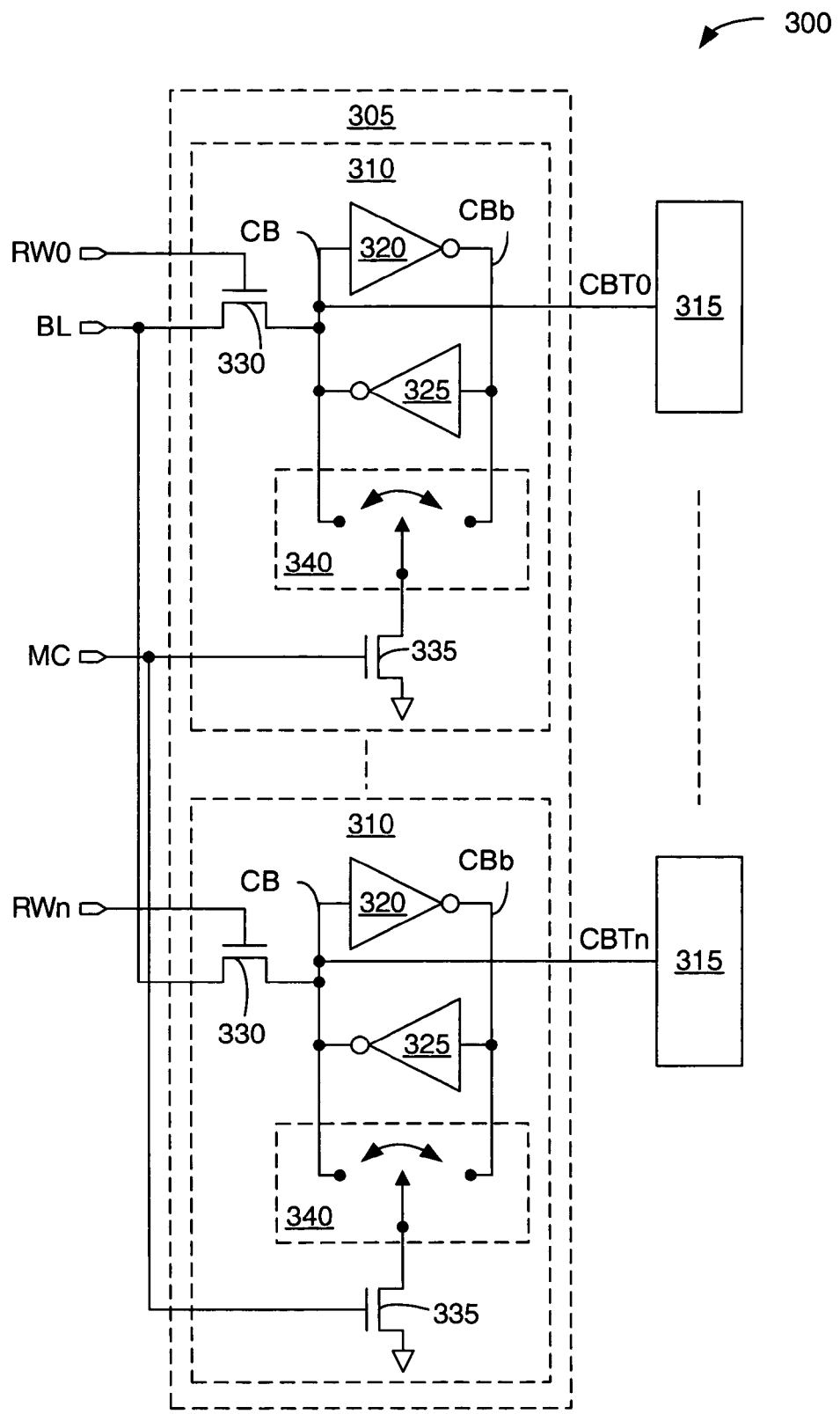
FIG. 3 depicts a logic circuit 300 that includes an array 305 of N memory cells 310.

FIG. 3 depicts a logic circuit 300 that includes an array 305 of N memory cells 310. In accordance with one embodiment, memory cells 310 combine ROM (read-only memory) and RAM (random-access memory) functionality. PLDs incorporating memory array 305 to store configuration data can be mask-programmed with a customer design, thereby acting as a ROM, and so facilitate ported designs from PLDs. The mask programming can be disabled, in which case each memory cell 310 behaves as a static, random-access memory (SRAM) bit. In this mode, the PLD employing memory array 305 behaves as a reprogrammable PLD, and can therefore be tested using generic test procedures. Memory array 305 thus eliminates the burdensome task of developing application-specific test procedures for designs ported from a PLD. As an added benefit, memory array 305 is not susceptible to radiation-induced upsets when memory cells 310 are in the ROM mode, so for example, PLDs incorporating array 305 are better suited for aerospace applications than conventional SRAM-based PLDs.

Each of memory cells 310 is connected to a single bitline BL and a corresponding one of N configurable resources 315. Configurable resources 315 might be, for example, macrocells, configurable logic blocks (CLBs), programmable routing resources, input/output blocks, and so on.

Memory cell 310 includes complementary first and second bit nodes CB and CBb, between which extends a pair of cross-coupled inverters 320 and 325. A configuration bit terminal CBT transmits a configuration voltage from bit node CB to configurable resource 315 to control the configurable resource. An access transistor 330 connects bit node CB to bitline BL in response to an asserted read-write signal RW during write and read accesses. Cross-coupled inverters 320 and 325 and access transistor 330 work together as a conventional SRAM cell.

The SRAM functionality of memory cell 310 is extended in accordance with one embodiment to provide read-only memory (ROM) functionality. A mask-programmable interconnection 340 can be mask-programmed to connect either of complementary bit nodes CB or CBb to a memory transistor 335. Transistor 335 then connects the connected bit node to ground in response to a memory control signal MC, forcing memory cell 310 into a mask-programmed state. Memory cell 310 thus functions as a ROM when memory control signal MC is asserted and functions as a RAM when memory control signal MC is de-asserted. Note that in other embodiments, transistor 335 may connect the connected bit node to another power supply terminal such as VDD. (As with other designations herein, CB, RW, and CBb each refer both to a signal and its corresponding node; whether a given designation refers to a signal or a node will be clear from the context.)

Memory cell 310 can be viewed as a composite-memory cell that includes (1) a static random-access memory (SRAM) cell made up of cross-coupled inverters 320 and 325 and (2) a read-only memory (ROM) cell that includes transistor 335. Thus constituted, composite-memory cell 310 operates in SRAM and ROM modes, as controlled by memory control signal MC. Asserting memory control signal MC puts composite-memory cell 310 into the ROM mode, in which case memory transistor 335 controls the configuration voltage transmitted to configurable resources 315 and a bitline voltage on bitline BL during a read access. De-asserting signal MC puts composite-memory cell 310 into the SRAM mode, in which case cross-coupled inverters 320 and 325 control node voltages CB and CBb. In the SRAM mode, the voltages on nodes CB and CBb can be altered by providing a write voltage on bitline BL and asserting read-write signal RW. Similar to a read access in the ROM mode, access transistor 330 transmits the configuration voltage CB to bitline BL in response to an asserted read-write signal RW, effecting an SRAM read. Transistors 335 thus serve as mode switches that alternatively place circuit 300 in the RAM mode or the ROM mode.

Figure 2:
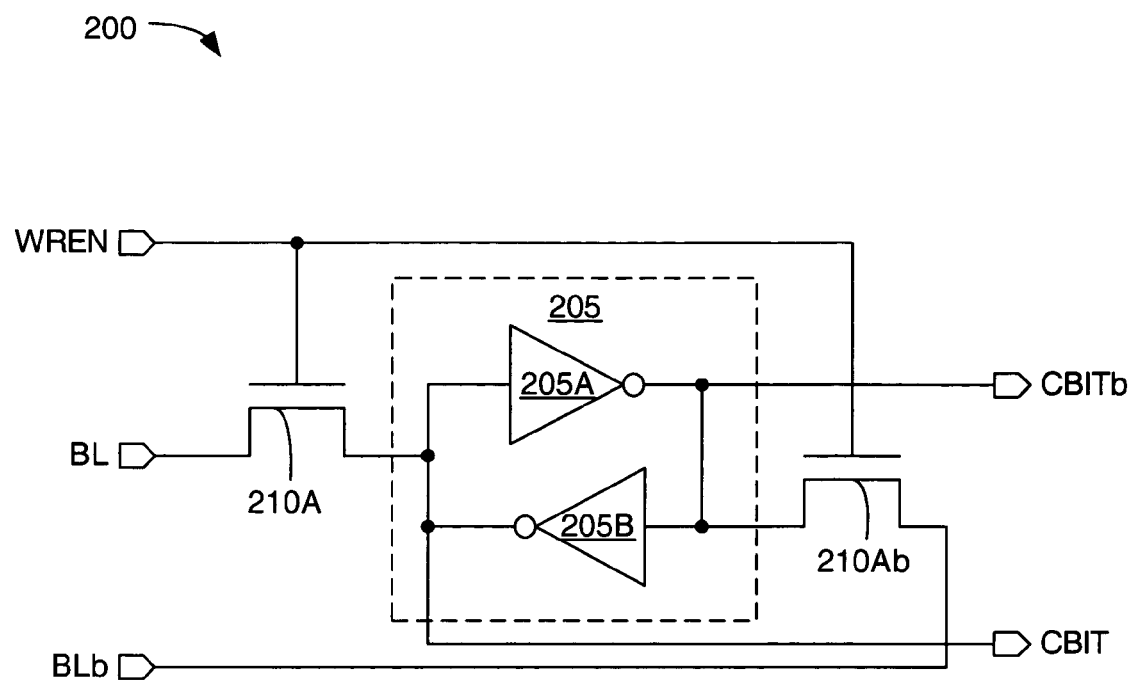
FIG. 2 is a six-transistor static random-read memory cell (6T SRAM) 200 employed as in configuration memory of PLD 100 of FIG. 1.

For example, when signal MC is de-asserted, memory cell 310 operates similarly to memory cell 200, shown in FIG. 2. When signal MC is asserted, memory cell 310 operates as a ROM cell. When signal MC is asserted, if mask-programmable interconnection 340 is programmed to connect bit node CB to transistor 335, then bit node CB will be at a logic low and bit node CBb will be a logic high. The logic low voltage at bit node CB may be transmitted to configurable resource 315 via configurable bit terminal CBT, and may be transmitted to bitline BL during a read operation when read-write signal RW is asserted. If mask-programmable interconnection 340 is instead programmed to connect bit node CBb to transistor 335, then bit node CB will be at a logic high and bit node CBb will be a logic low. The logic high voltage at bit node CB may be similarly transmitted to configurable resource 315 and/or bitline BL.

Figure 4:
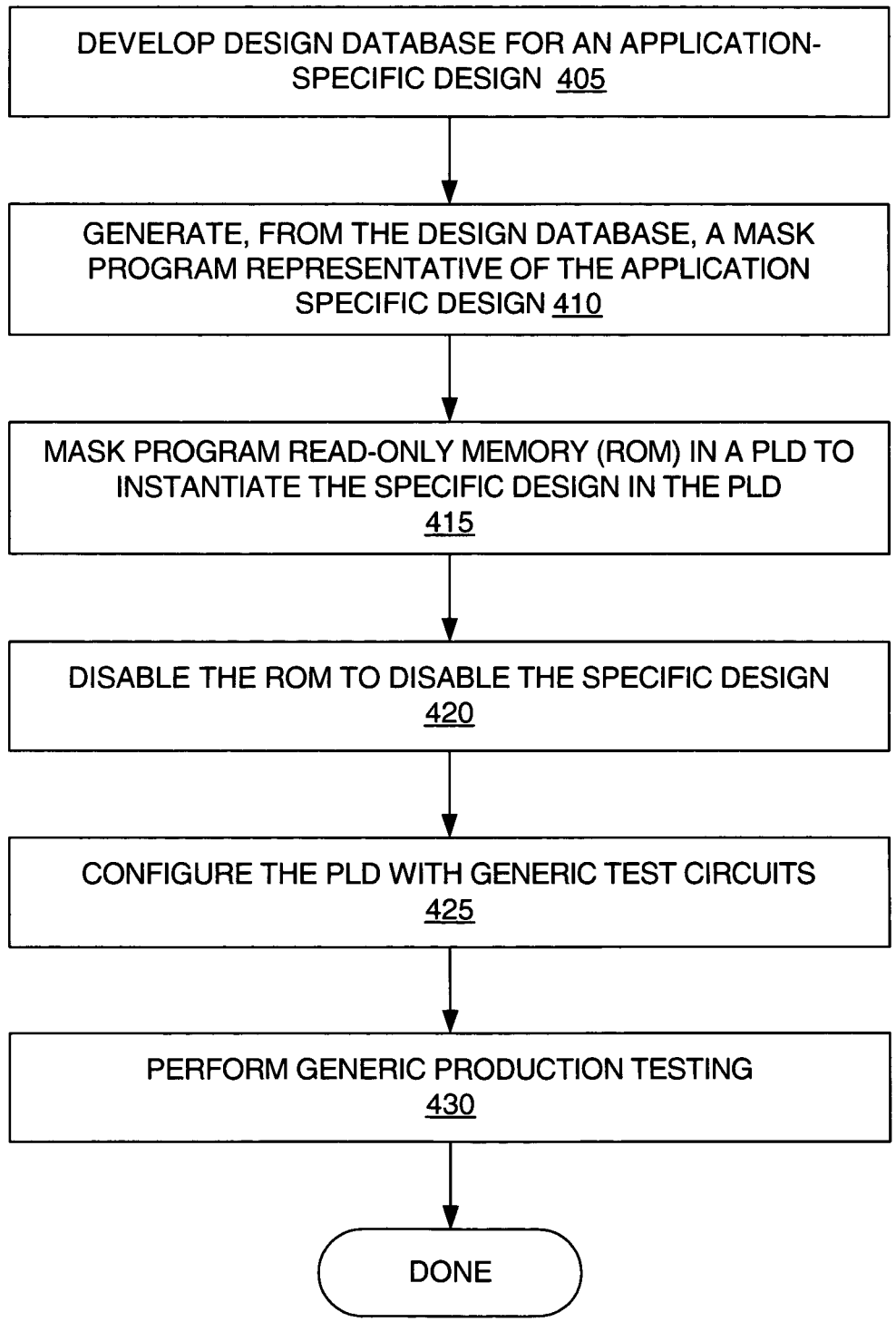
FIG. 4 is a flowchart illustrating a method of instantiating an application-specific design on a PLD employing circuit 300 of FIG. 3.

FIG. 4 is a flowchart 400 illustrating a method of instantiating an application-specific design on a PLD and then functionally testing the application-specific PLD using generic test methods. The following discussion references a PLD assumed to include configuration memory of the type described in FIG. 3.

As is conventional, circuit designers employ various software tools to develop a design database describing an application-specific circuit design (step 405). Other software tools then translate the design database into configuration data suitable for instantiating the circuit design into a targeted mask-programmable PLD (step 410). In PLDs that store configuration data in the manner described above in connection with FIG. 3, the configuration data defines a mask program representative of the application-specific circuit design.

The mask program determines, for each memory cell 310, whether transistor 335 connects to bit node CB or to bit node CBb. As part of the fabrication process, one of the metal layers of the target PLD is customized, as specified in the mask program, to connect the drain of transistor 335 to bit node CB in a first set of memory cells 310 and to connect the drain of transistor 335 in a second set of memory cells 310 to bit node CBb (step 415). The target PLD thus becomes an ASIC customized with the application-specific circuit design. Processes for customizing metal layers to establish optional connections are well known to those of skill in the art.

The target PLD, now an ASIC, can nevertheless be tested using generic test procedures developed for the selected PLD type. In step 420, the mask programming is disabled, such as by deasserting control signal MC to transistors 335. The mask-programmed PLD then behaves as a conventional SRAM-based PLD, in which case each configuration memory cell 310 behaves as an SRAM bit. Once in this SRAM "mode," the PLD is configured to instantiate generic test circuits (step 425) and subjected to generic production testing (step 430). The dual-mode memory cells 310 thus eliminate the burdensome task of developing application-specific test procedures for designs ported from a PLD to an ASIC.

Generic test procedures for testing PLDs are well known to those of skill in the art. For a detailed discussion of some generic test methods and their application to PLDs, see U.S. Pat. No. 6,539,508 entitled "Methods and Circuits for Testing Programmable Logic," which issued Mar. 25, 2003, to Robert Patrie and Robert Wells and is incorporated herein by reference in its entirety.

Figure 5:
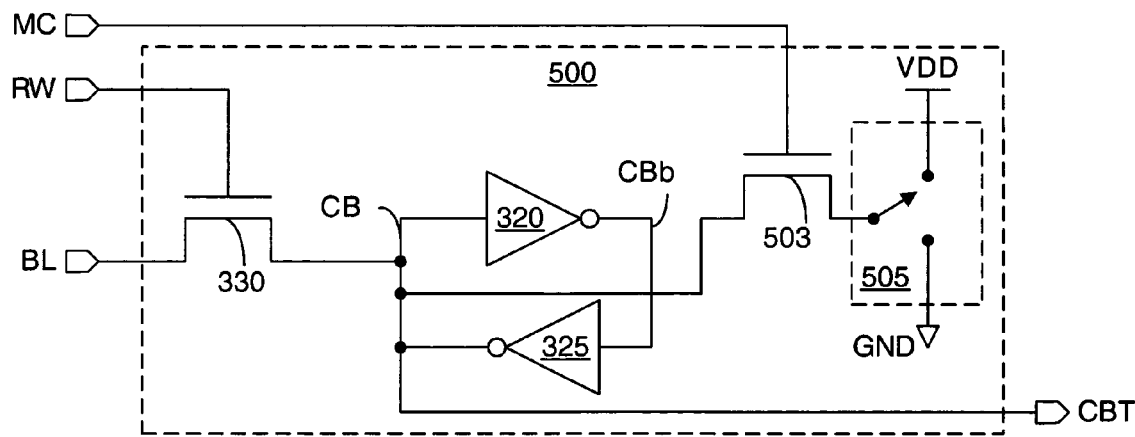
FIG. 5 depicts a composite-memory cell 500 in accordance with another embodiment.

FIG. 5 depicts a composite-memory cell 500 in accordance with another embodiment. Composite-memory cell 500 is similar to composite memory cell 310 of FIG. 3, like or similar elements having the same label. Unlike cell 310, composite-memory cell 500 includes a memory transistor 503 connected to node CB and a mask-programmable interconnect 505 that provides a programmable interconnection to one of first and second power supply terminals, VDD and GND, respectively. The operation and method of mask programming cell 500 is similar to the operation and method of mask programming of cell 310. Therefore the discussion of the operation and method of mask programming cell 500 is excluded for brevity.

Figure 6:
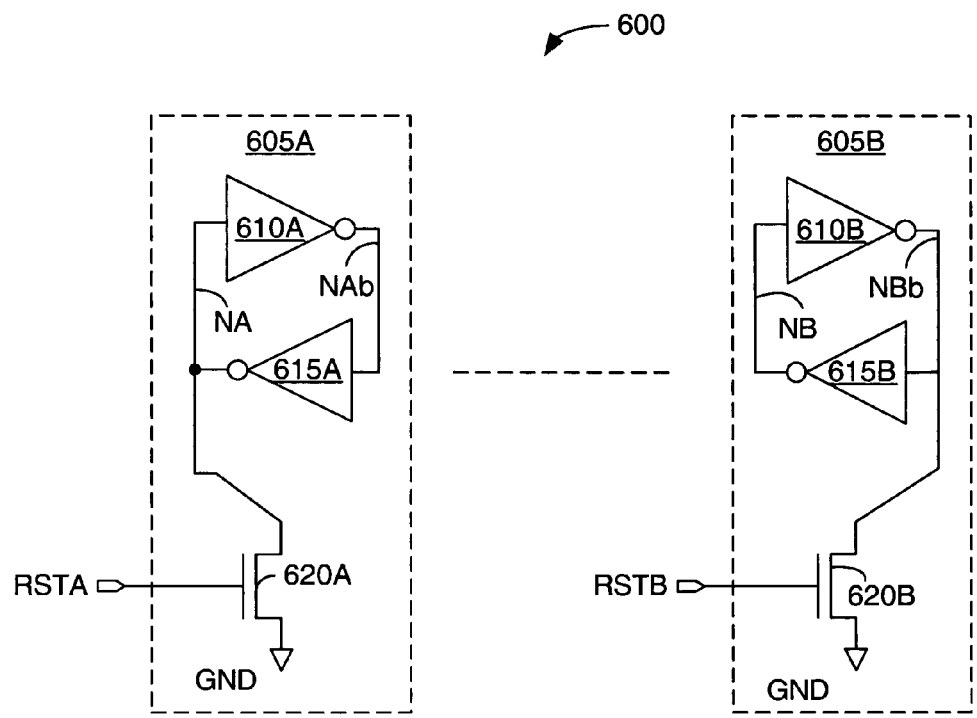
FIG. 6 depicts a circuit 600 in accordance with another embodiment.

FIG. 6 depicts a circuit 600 in accordance with another embodiment. Circuit 600 includes a plurality of latches 605A and 605B receiving respective reset signals RSTA and RSTB. Latch 605A includes complementary nodes NA and NAb between which extends a pair of cross-coupled inverters 610A and 615A. Similarly, latch 605B includes complementary nodes NB and NBb between which extends a pair of cross-coupled inverters 610B and 615B. Latches 605A and 605B additionally include respective reset transistors 620A and 620B each connected to a power supply terminal GND. Reset transistor 620A connects to node NA, while reset transistor 620B connects to node NBb. Transistors 620A and 620B connect respective nodes NA and NBb to power supply terminal GND in response to reset signals RSTA and RSTB, respectively. During a reset operation, latch 605A transmits a logic zero representative of a lowest supply voltage GND on terminal NA and a logic one representative of a highest voltage VDD on node NAb in response to asserted reset signal RSTA. Latch 605B transmits a logic one on node NB and a logic zero on node NBb in response to asserted reset signal RSTB.

Figure 1:
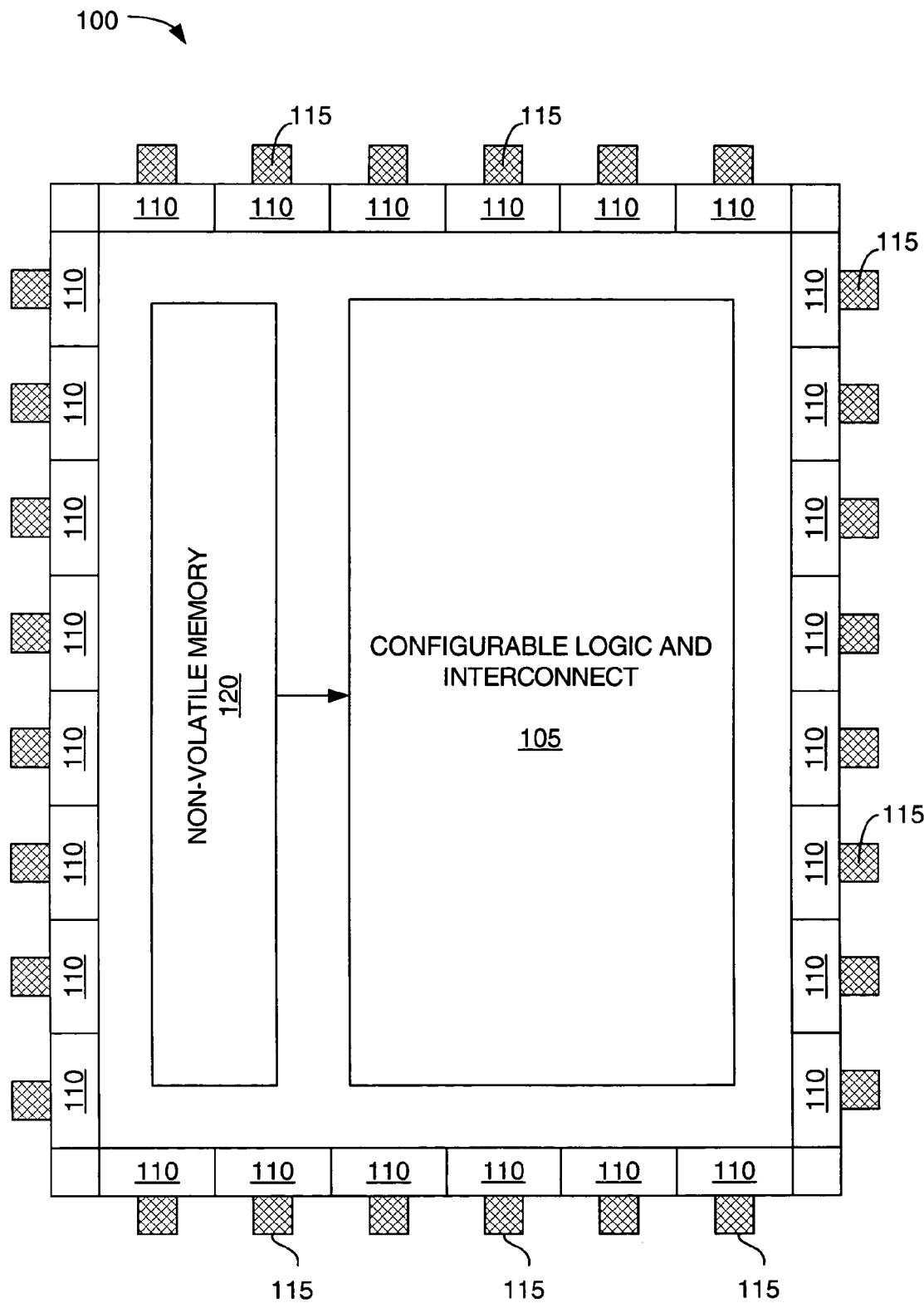
FIG. 1 is a block diagram depicting one form of PLD (PLD) 100.

In one embodiment, terminals RSTA and RTSB are connected together. Thus, asserting the reset signal RST simultaneously resets a first plurality of latches 620A to a logic zero and a second plurality of latches 620B to a logic one. Latches 605A and 605B can be used to implement configuration memory in PLDs of the type described above in connection with FIG. 1, for example, in which case various parts of the configurable logic, interconnect, and input/output blocks reset to different logic states. For example, latches 605A and 605B can be used in input/output pins that require to be set to a logic zero and logic one, respectively, during power up. As with memory cells 310 (FIG. 3) and 500 (FIG. 5), memory cells 605 may be mask-programmed. For instance, a mask-programmable interconnect may selectively connect one of nodes NA and NAb to transistor 620A. Also, as is known in the art, another power supply terminal, such as VDD, may be coupled to transistors 620.

While the present invention has been described in connection with specific embodiments, variations of these embodiments will be obvious to those of ordinary skill in the art. For example, implementation of the invention is not limited to PLDs, but may be implemented in any integrated circuit that includes a configuration memory. Further, the programmable interconnection may be implemented in any number of ways, including antifuses. The composite-memory cell can be made out of any of the typical read-write random-access memory cells, including dynamic random-access memory DRAM, double data rate memory DDR, and any of the conventional non-volatile memory cells, including EEPROMs, and flash PROMs. Therefore, the spirit and scope of the appended claims should not be limited to the foregoing description.

What is claimed is:

1. A memory array comprising:
   a bitline; and
   a plurality of memory cells, each of the plurality of memory cells having:
   a configuration bit terminal;
   a pair of cross-coupled inverters having first and second bit nodes, wherein one of the first and second bit nodes is connected to the configuration bit terminal;
   an access transistor having a first current-carrying terminal connected to the bitline, a second current-carrying terminal connected to the first bit node, and an access-transistor control terminal; and
   a memory transistor having a first current-carrying terminal connected to one of the first and second bit nodes, a second current-carrying terminal connected to a power supply node, and a memory-transistor control terminal;
   wherein each of the plurality of memory cells further includes a programmable interconnection interposed between the first current-carrying terminal of the memory transistor and the first and second bit nodes; and
   wherein the programmable interconnection connects the first current-carrying terminal of the memory transistor to the first bit node when programmed in a first state, and connects the first current-carrying terminal of the memory transistor to the second bit node when programmed in a second state.

2. The memory array of claim 1, further comprising a second configuration bit terminal connected to the first bit node, wherein the first-mentioned configuration bit terminal connects to the second bit node.

3. The memory array of claim 1, further comprising a configurable resource connected to the configuration bit terminal, the configuration terminal transmitting a configuration voltage to the configurable resource.

4. The memory array of claim 1, the access-transistor control terminal receiving at least one of a read control signal and a write control signal.

5. The memory array of claim 1, wherein each of the plurality of memory cells further includes a mask-programmable interconnect providing the programmable interconnection.

6. The memory array of claim 1, wherein in a first set of the plurality of memory cells the first current-carrying terminal of the memory transistor connects to the first bit node via the programmable interconnection, and wherein in a second set of the plurality of memory cells the first current-carrying terminal of the memory transistor connects to the second bit node via the programmable interconnection.

7. A memory array comprising:
   a bitline; and
   a plurality of memory cells, each of the plurality of memory cells having:
   a configuration bit terminal;
   a pair of cross-coupled inverters having first and second bit nodes, wherein one of the first and second bit nodes is connected to the configuration bit terminal;
   an access transistor having a first current-carrying terminal connected to the bitline, a second current-carrying terminal connected to the first bit node, and an access-transistor control terminal; and a memory transistor having a first current-carrying terminal connected to one of the first and second bit nodes, a second current-carrying terminal connected to a one of first and second power supply nodes nodes, and a memory-transistor control terminal;

wherein each of the plurality of memory cells further includes a programmable interconnection interposed between the second current-carrying terminal of the memory transistor and the first and second power supply nodes.

8. The memory array of claim 7, wherein each of the plurality of the memory cells further includes a mask-programmable interconnect providing the programmable interconnection.

9. The memory array of claim 7, wherein in a first set of the plurality of memory cells the second current-carrying terminal of the memory transistor connects to the first power supply node via the programmable interconnection, and wherein in a second set of the plurality of memory cells the second current-carrying terminal of the memory transistor connects to the second power supply node via the programmable interconnection.

10. The memory array of claim 7, wherein the first power supply node is VDD and the second power supply node is ground.

11. The memory array of claim 1, wherein the cross-coupled pair of inverters is part of a static random-access memory (SRAM) cell.

12. The memory array of claim 1, wherein the memory transistor is part of a read-only memory (ROM) cell.

13. The memory array of claim 1, wherein the memory array is part of a configuration memory of a programmable logic device.

14. The memory array of claim 1, further comprising a memory control terminal connected to the memory transistor control terminals, the memory control terminal having first and second states, wherein the first state configures the memory cells as read-only memory (ROM) and the second state configures the memory cells as random-access memory (RAM).

15. The memory array of claim 14, wherein the circuit is part of a configuration memory of a programmable logic device, and wherein the first state of the memory control terminal renders the programmable logic device an application specific circuit (ASIC).

16. The memory array of claim 1, wherein the power supply node is ground.

17. A circuit comprising:
a plurality of memory cells, each memory cell supporting a random-access memory mode and a read-only memory mode; and
an array of configurable logic resources connected to the memory cells;
wherein each memory cell includes a mode switch selecting one of the random-access memory mode or the read-only memory mode; and
wherein each memory cell further includes a configuration bit terminal, each configuration bit terminal coupled to at least one configurable logic resource in the array of configurable logic resources.

18. The circuit of claim 17, wherein each memory cell includes a random-access memory cell and a read-only memory cell.

19. The circuit of claim 18, wherein the read-only memory cells are mask programmable.

20. A programmable logic device comprising:
configurable logic resources having a plurality of configuration bit terminals; and
a plurality of memory cells, each memory cell including:
a configuration bit node connected to one of the plurality of configuration bit terminals of the configurable logic resources and providing a configuration-bit signal;
a random-access memory element;
a read-only memory element; and
at least one memory control terminal selecting one of the random-access memory element and the read-only memory element to control the configuration-bit signal.

21. The programmable logic device of claim 20, wherein the read-only memory element is mask programmed.

22. The programmable logic device of claim 20, wherein the random-access memory element is a static random-access memory element.

* * * * *